(12) United States Patent
Usami

(10) Patent No.: US 10,002,883 B2
(45) Date of Patent: Jun. 19, 2018

(54) SEMICONDUCTOR DEVICE AND MANUFACTURING METHOD THEREOF

(71) Applicant: Renesas Electronics Corporation, Koutou-ku, Tokyo (JP)

(72) Inventor: Tatsuya Usami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/462,814

(22) Filed: Mar. 18, 2017

(65) Prior Publication Data
US 2017/0287934 A1  Oct. 5, 2017

(30) Foreign Application Priority Data
Mar. 31, 2016 (JP) ................. 2016-070284

(51) Int. Cl.
| | | |
|---|---|---|
| H01L 21/70 | (2006.01) | |
| H01L 27/12 | (2006.01) | |
| H01L 23/34 | (2006.01) | |
| H01L 21/84 | (2006.01) | |
| H01L 23/538 | (2006.01) | |
| H01L 21/3213 | (2006.01) | |
| H01L 21/311 | (2006.01) | |
| H01L 21/48 | (2006.01) | |
| G02B 6/132 | (2006.01) | |
| G02B 6/12 | (2006.01) | |

(52) U.S. Cl.
CPC .......... *H01L 27/1203* (2013.01); *G02B 6/132* (2013.01); *H01L 21/31111* (2013.01); *H01L 21/32139* (2013.01); *H01L 21/4853* (2013.01); *H01L 21/84* (2013.01); *H01L 23/345* (2013.01); *H01L 23/5386* (2013.01); *G02B 2006/12061* (2013.01)

(58) Field of Classification Search
CPC .......... H01L 21/4853; H01L 21/31111; H01L 21/32139; H01L 21/84; H01L 23/345; H01L 23/5386; G02B 6/132; G02B 2006/12061
See application file for complete search history.

(56) References Cited

U.S. PATENT DOCUMENTS

| | | | | |
|---|---|---|---|---|
| 2006/0278331 A1* | 12/2006 | Dugas | ................. | H01L 21/6835 156/230 |
| 2011/0292960 A1* | 12/2011 | Shoji | ..................... | H01S 5/0265 372/50.11 |
| 2015/0194460 A1* | 7/2015 | Maekawa | ......... | H01L 27/14685 438/70 |

OTHER PUBLICATIONS

Andy Eu-Jin Lim et al., "Review of Silicon Photonics Foundry Efforts," IEEE Journal of Selected Topics in Quantum Electronics, vol. 20, No. 4, Jul./Aug. 2014.

* cited by examiner

*Primary Examiner* — Yosef Gebreyesus
(74) *Attorney, Agent, or Firm* — Shapiro, Gabor and Rosenberger, PLLC

(57) ABSTRACT

An optical waveguide for optical signals is formed in a semiconductor layer of an SOI substrate, a heater for heating the optical waveguide is formed on a silicon oxide film which covers the optical waveguide, and wirings for supplying power to the heater are connected to both ends of the heater. Each of the wirings is constituted of a laminated film of a bottom barrier metal film, an aluminum-copper alloy film serving as a main conductive film and a top barrier metal film, and the heater is constituted integrally with the bottom barrier metal film constituting a part of each of the wirings.

5 Claims, 27 Drawing Sheets

SEMICONDUCTOR DEVICE AND MANUFACTURING METHOD THEREOF

CROSS-REFERENCE TO RELATED APPLICATION

The present application claims priority from Japanese Patent Application No. 2016-070284 filed on Mar. 31, 2016, the content of which is hereby incorporated by reference into this application.

TECHNICAL FIELD OF THE INVENTION

The present invention relates to a semiconductor device and a manufacturing method of the semiconductor device, and can be effectively utilized for, for example, a semiconductor device including an SOI (Silicon On Insulator) substrate in which an optical waveguide made of silicon (Si) is formed and manufacture of the semiconductor device.

BACKGROUND OF THE INVENTION

In recent years, the development of the so-called silicon photonics technology to realize an optical communication module by forming optical waveguides (optical signal transmission paths) made of silicon (Si) in a part of a silicon substrate and integrating optical circuits and electronic devices constituted of the optical waveguides has been actively pursued.

The semiconductor device in which optical waveguides made of silicon are formed in a part of a silicon substrate consumes extremely low power, and has favorable advantages of being able to realize a small-sized optical communication module by forming silicon integrated circuits and optical waveguides in the same silicon substrate.

Andy Eu-Jin Lim et al., "Review of Silicon Photonics Foundry Efforts" IEEE Journal of selected Topics in Quantum Electronics Vol. 20. No. 4 July/August 2014 (Non-Patent Document 1) discloses an optical semiconductor device in which a heater made of a titanium nitride (TiN) film is formed on an insulating film over a silicon optical waveguide formed in a part of an SOI substrate.

SUMMARY OF THE INVENTION

For forming a heater on an insulating film over an optical waveguide formed in a part of an SOI substrate, a conductive film such as a titanium nitride film is first deposited over the insulating film which covers the optical waveguide, and the conductive film is then patterned to form the heater. Thereafter, an interlayer insulating film is deposited over the heater and is etched to form a contact hole which reaches the heater, and an aluminum-based (Al-based) conductive film deposited over the interlayer insulating film is then patterned, thereby forming a wiring to supply power to the heater through the contact hole.

The semiconductor device in which the heater is formed above the optical waveguide formed in a part of the SOI substrate as described above has a problem of the increase in manufacturing cost of the semiconductor device because a large number of processes are necessary to form the heater and the wiring to supply power to the heater.

The other problems and novel characteristics of the present invention will be apparent from the description of the present specification and the accompanying drawings.

A semiconductor device according to one embodiment includes: an optical waveguide formed in a semiconductor layer of an SOI substrate; a heater formed on a first insulating film which covers the optical waveguide; and a first wiring and a second wiring which are formed on the first insulating film and are electrically connected to the heater, each of the first wiring and the second wiring is constituted of a laminated film including a barrier metal film and a main conductive film, and the heater is formed to include the barrier metal film constituting a part of each of the first wiring and the second wiring.

In a manufacturing method of a semiconductor device according to one embodiment, when forming a heater on a first insulating film which covers an optical waveguide formed in a semiconductor layer of an SOI substrate and a first wiring and a second wiring electrically connected to the heater, each of the first wiring and the second wiring is formed of a laminated film including a barrier metal film and a main conductive film, and the heater is formed of a conductive film including the barrier metal film constituting apart of each of the first wiring and the second wiring.

According to one embodiment, it is possible to shorten the process of forming the heater above the optical waveguide formed in a part of the SOI substrate.

BRIEF DESCRIPTIONS OF THE DRAWINGS

DESCRIPTIONS OF THE PREFERRED EMBODIMENTS

Figure 1:
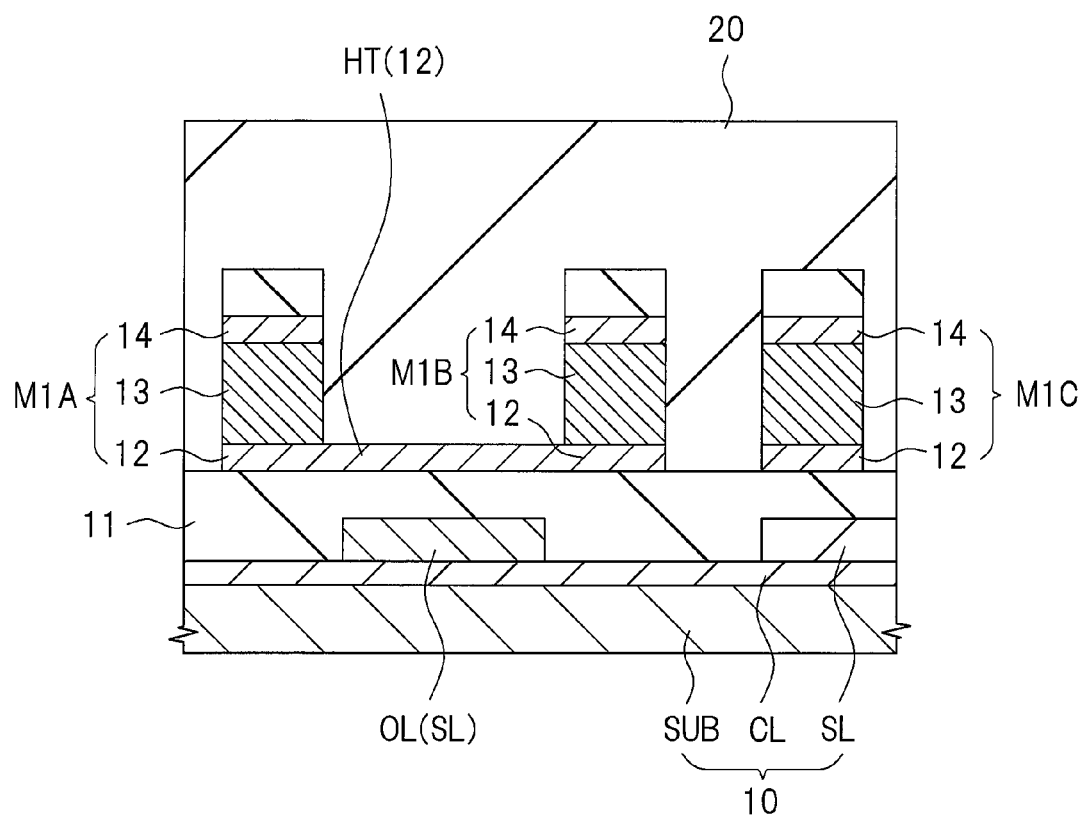
FIG. 1 is a cross-sectional view showing a principal part of a semiconductor device according to a first embodiment.

Hereinafter, embodiments of the present invention will be described in detail with reference to drawings. Note that components having the same function are denoted by the same reference characters throughout the drawings for describing the embodiments in principle, and the repetitive description thereof will be omitted.

First Embodiment

<Semiconductor Device>

A structure of a semiconductor device according to the first embodiment will be described with reference to FIG. 1. FIG. 1 is a cross-sectional view showing a principal part of the semiconductor device according to the first embodiment.

The semiconductor device includes an SOI substrate 10 constituted of a support substrate SUB made of single crystal silicon, a silicon oxide layer (referred to also as BOX layer or cladding layer) CL formed over the support substrate SUB and a semiconductor layer (referred to also as SOI layer) SL made of single crystal silicon formed over the silicon oxide layer CL. The SOI substrate 10 can be formed by, for example, the SIMOX (Silicon Implanted Oxide) method, the bonding method and the smart-cut method. As an example, a thickness of the support substrate SUB is about 750 μm, a thickness of the silicon oxide layer CL is about 2 μm, and a thickness of the semiconductor layer SL is about 200 nm.

An optical waveguide OL for transmitting optical signals formed by patterning a part of the semiconductor layer SL is formed on the silicon oxide layer CL. The optical waveguide OL shown in the drawing is a rectangular waveguide whose cross section in a direction orthogonal to a traveling direction of optical signals (direction perpendicular to the paper in this case) has a quadrangular shape, but is not limited to this and may be a rib waveguide whose cross section in the direction orthogonal to the traveling direction of optical signals has a convex shape to provide the effect of confining light in lateral directions. In addition, though FIG. 1 shows one optical waveguide OL on the silicon oxide layer CL, a plurality of optical waveguides OL may be provided.

In an unillustrated region of the semiconductor layer SL, a plurality of MOSFETs (semiconductor elements) constituting silicon integrated circuits are formed. As an example, the MOSFET is a fully-depleted MOSFET in which source and drain with high impurity concentration are formed in the semiconductor layer SL on both sides of a depletion layer made of the semiconductor layer SL and a gate electrode is formed on the depletion layer with a gate insulating film interposed therebetween.

A silicon oxide film (first insulating film) 11 is formed over the optical waveguide OL and the semiconductor layer SL, and both side surfaces and an upper surface of the optical waveguide OL are covered with the silicon oxide film 11.

A heater HT and a pair of wirings M1A and M1B electrically connected to the heater HT are formed on the silicon oxide film 11. The heater HT is a heat source to adjust the phase of optical signals flowing in the optical waveguide OL by changing the temperature of the optical waveguide OL. Namely, when power is conducted to the heater HT through the pair of wirings M1A and M1B connected to the heater HT, the heater HT is heated and the heat is transmitted to the optical waveguide OL through the silicon oxide film 11.

In addition, a wiring M1C is also formed on the silicon oxide film 11 together with the heater HT and the pair of wirings M1A and M1B. The wiring M1C is a wiring for electrically connecting a plurality of MOSFETs constituting the silicon integrated circuits formed in the unillustrated region of the semiconductor layer SL.

Each of the wirings M1A, M1B and M1C is constituted of a laminated film of a bottom barrier metal film (first barrier metal film) 12, a main conductive film 13 and a top barrier metal film (second barrier metal film) 14. The main conductive film 13 is made of a conductive film with low resistance composed mainly of aluminum, for example, an aluminum-copper alloy film. The bottom barrier film 12 is a conductive film for preventing diffusion of aluminum constituting the main conductive film 13 and is made of, for example, a titanium nitride film or a laminated film of a titanium nitride film and a titanium film. The top barrier metal film 14 is a conductive film functioning as an etching stopper when the main conductive film 13 is patterned by dry etching and is made of, for example, a titanium nitride film or a laminated film of a titanium nitride film and a titanium film.

The heater HT of the first embodiment is characterized by being constituted integrally with the above-mentioned bottom barrier metal film 12 constituting a part of each of the wirings M1A and M1B.

The wirings M1A, M1B and M1C and the heater HT are covered with a protection film 20. The protection film 20 is made of, for example, a silicon oxynitride (SiON) film, a PSG (Phospho Silicate Glass) film or a silicon nitride ($Si_3N_4$) film deposited by the CVD method.

Upper wirings formed in one layer or plural layers and electrically connected to the wirings M1A, M1B and M1C may be formed on the protection film 20. In this case, a bottom barrier metal film of each of a pair of upper wirings may be constituted integrally with a heater instead of constituting the bottom barrier metal film 12 of each of the pair of wirings M1A and M1B integrally with the heater HT.

<Manufacturing Method of Semiconductor Device>

A manufacturing method of the semiconductor device constituted in the above-described manner will be described in the order of processes with reference to FIG. 2 to FIG. 14.

Figure 2:
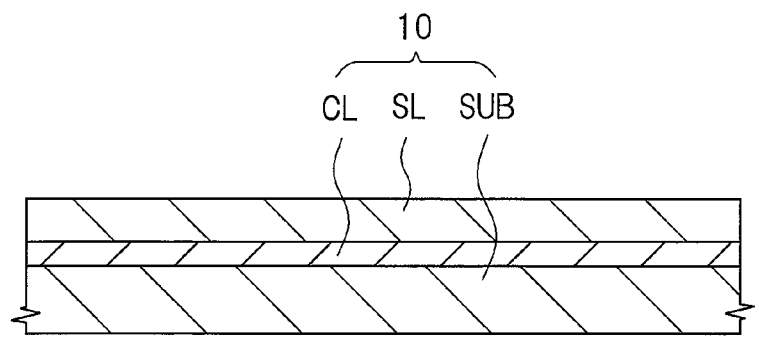
FIG. 2 is a cross-sectional view showing a principal part of the semiconductor device in a manufacturing process according to the first embodiment.

First, as shown in FIG. 2, the SOI substrate 10 constituted of the support substrate SUB, the silicon oxide layer CL and the semiconductor layer SL is prepared. The SOI substrate 10 is a substrate with an approximately circular planar shape referred to as SOI wafer in this stage.

Figure 3:
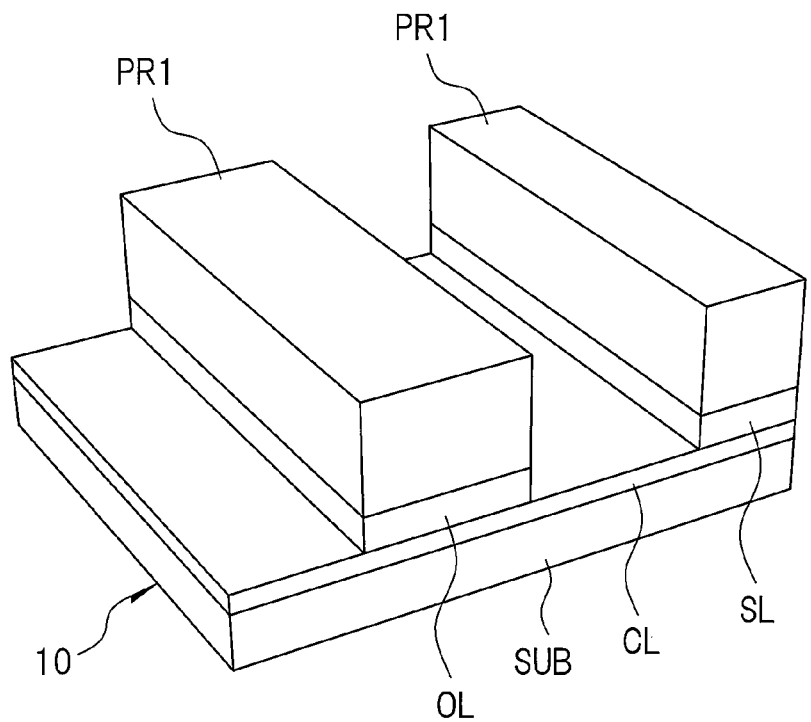
FIG. 3 is a perspective view showing a principal part of the semiconductor device in the manufacturing process subsequent to FIG. 2.
Figure 4:
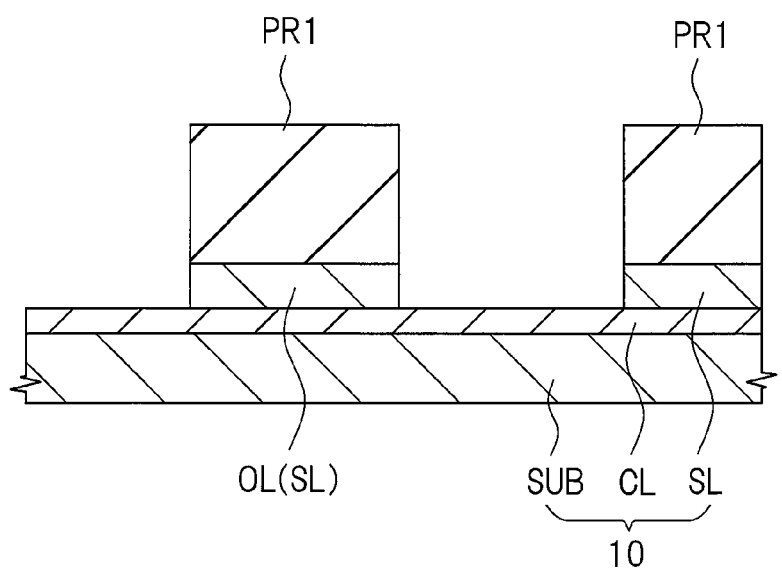
FIG. 4 is a cross-sectional view showing a principal part of the semiconductor device in the manufacturing process subsequent to FIG. 2.

Next, as shown in FIG. 3 and FIG. 4, the semiconductor layer SL is patterned by dry etching using a photoresist film RP1 formed on the semiconductor layer SL as a mask, so that the optical waveguide OL made of the semiconductor layer SL is formed in a part of the SOI substrate 10.

Next, after the photoresist film PR1 is removed, a p type impurity of about $1 \times 10^{13}$ $cm^{-3}$ is introduced into the optical waveguide OL by the ion-implantation method using a photoresist film (not illustrated) as a mask. Next, after the photoresist film is removed, the SOI substrate 10 is annealed for activating the p type impurity. In addition, a plurality of MOSFETs constituting the silicon integrated circuits are formed by an ordinary method in the unillustrated region of the semiconductor layer SL.

Figure 5:
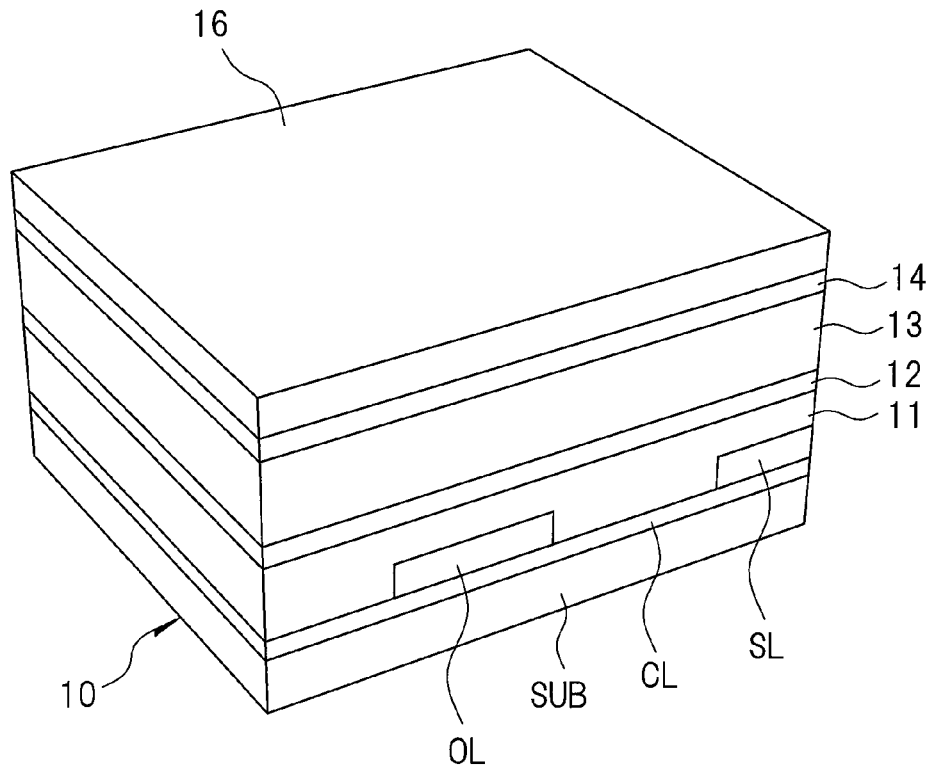
FIG. 5 is a perspective view showing a principal part of the semiconductor device in the manufacturing process subsequent to FIG. 3 and FIG. 4.
Figure 6:
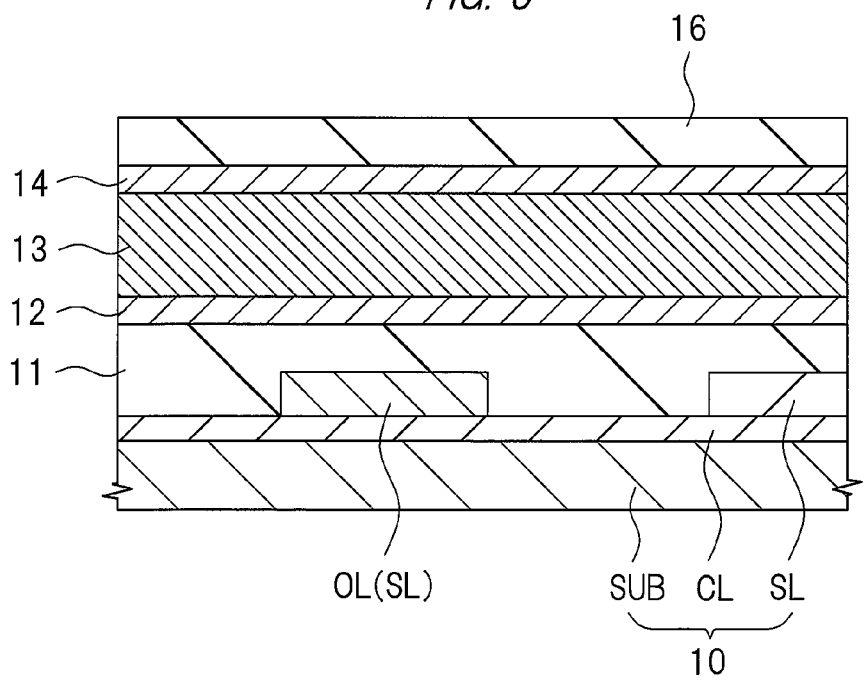
FIG. 6 is a cross-sectional view showing a principal part of the semiconductor device in the manufacturing process subsequent to FIG. 3 and FIG. 4.

Next, as shown in FIG. 5 and FIG. 6, after the silicon oxide film 11 is deposited over the optical waveguide OL and the semiconductor layer SL, a wiring material made of the bottom barrier metal film 12, the aluminum-copper alloy film 13 and the top barrier metal film 14 is deposited in this order by the sputtering method over the silicon oxide film 11, and a silicon oxide film 16 is then deposited over the top barrier metal film 14 by the CVD method.

The bottom barrier metal film 12 is a conductive film constituting a part of the wiring material and is also a conductive film constituting the heater HT which heats the optical waveguide OL, and the film thickness thereof is, for example, 50 nm to 100 nm.

Figure 7:
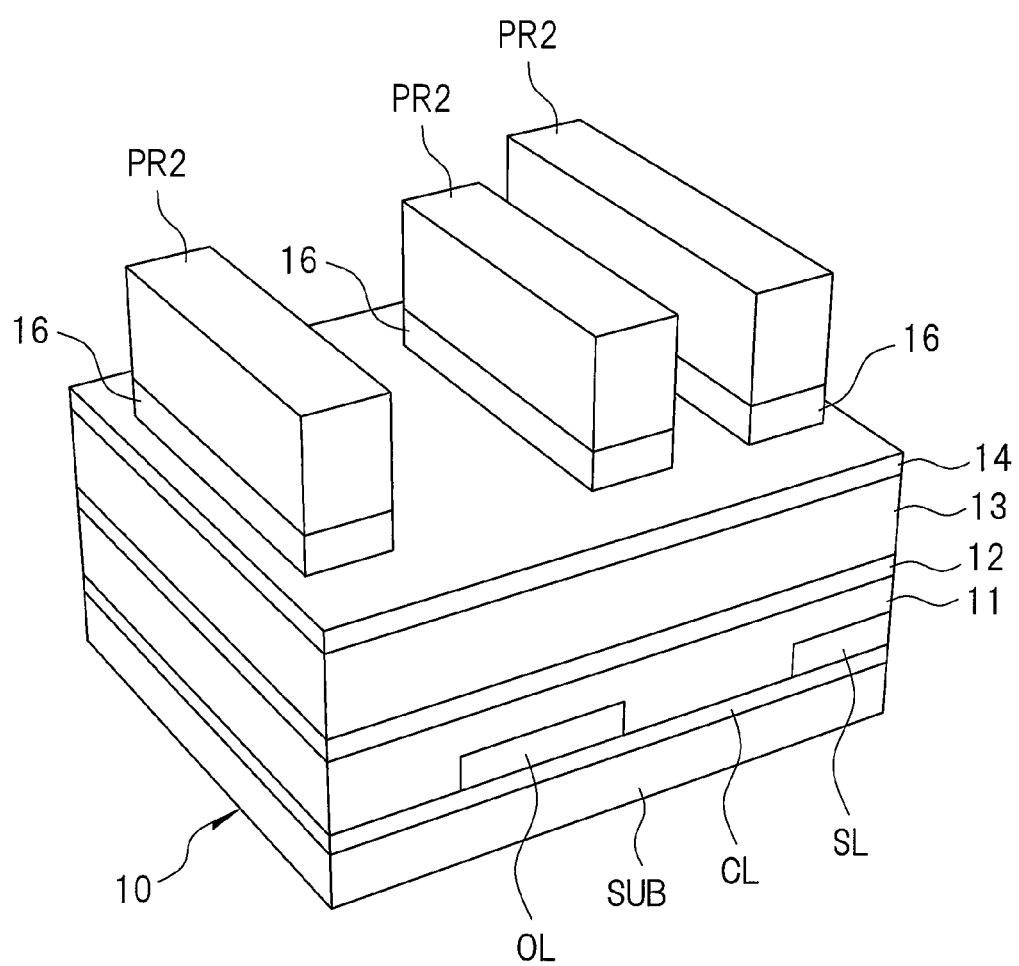
FIG. 7 is a perspective view showing a principal part of the semiconductor device in the manufacturing process subsequent to FIG. 5 and FIG. 6.
Figure 8:
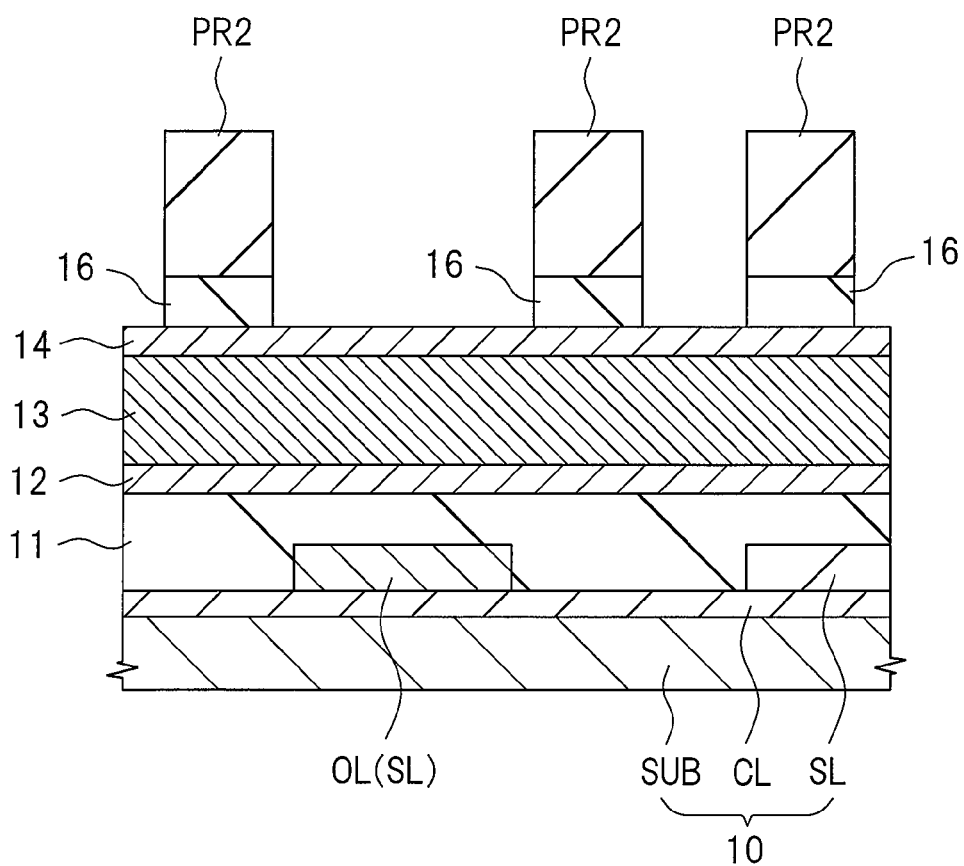
FIG. 8 is a cross-sectional view showing a principal part of the semiconductor device in the manufacturing process subsequent to FIG. 5 and FIG. 6.

Next, as shown in FIG. 7 and FIG. 8, a photoresist film PR2 is formed on the silicon oxide film 16, and the silicon oxide film 16 is patterned by dry etching using the photoresist film RP2 as a mask, thereby making the silicon oxide film 16 have the same planar shape as those of the wirings M1A, M1B and M1C.

Figure 9:
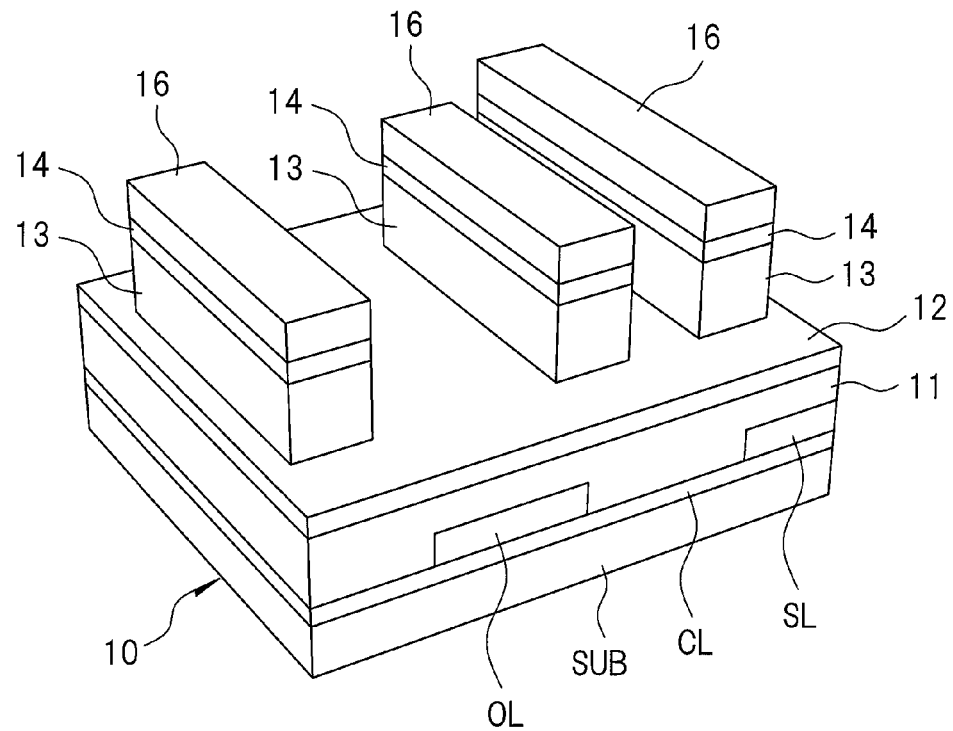
FIG. 9 is a perspective view showing a principal part of the semiconductor device in the manufacturing process subsequent to FIG. 7 and FIG. 8.
Figure 10:
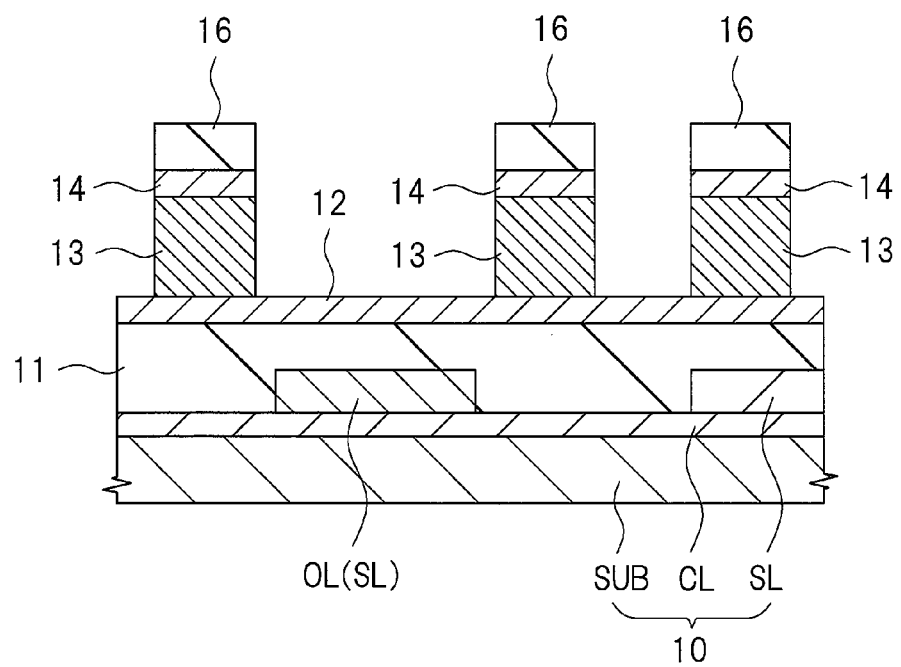
FIG. 10 is a cross-sectional view showing a principal part of the semiconductor device in the manufacturing process subsequent to FIG. 7 and FIG. 8.

Next, after the photoresist film PR2 is removed, the top barrier metal film 14 and the aluminum-copper alloy film 13 are sequentially patterned by dry etching using the silicon oxide film 16 as a mask (hard mask) as shown in FIG. 9 and FIG. 10, thereby exposing the surface of the bottom barrier metal film 12. Namely, among the top barrier metal film 14, the aluminum-copper alloy film 13 and the bottom barrier metal film 12 constituting the wiring material, the top barrier metal film 14 and the aluminum-copper alloy film 13 are made to have the same planar shape as those of the wirings M1A, M1B and M1C.

Figure 11:
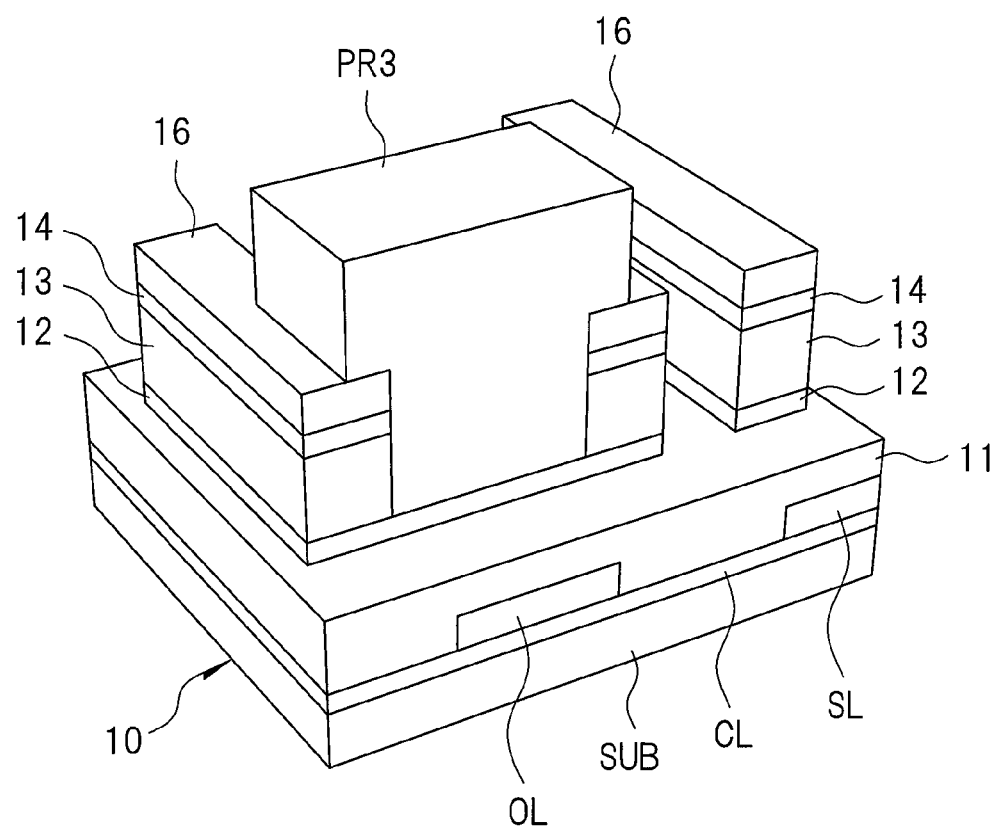
FIG. 11 is a perspective view showing a principal part of the semiconductor device in the manufacturing process subsequent to FIG. 9 and FIG. 10.
Figure 12:
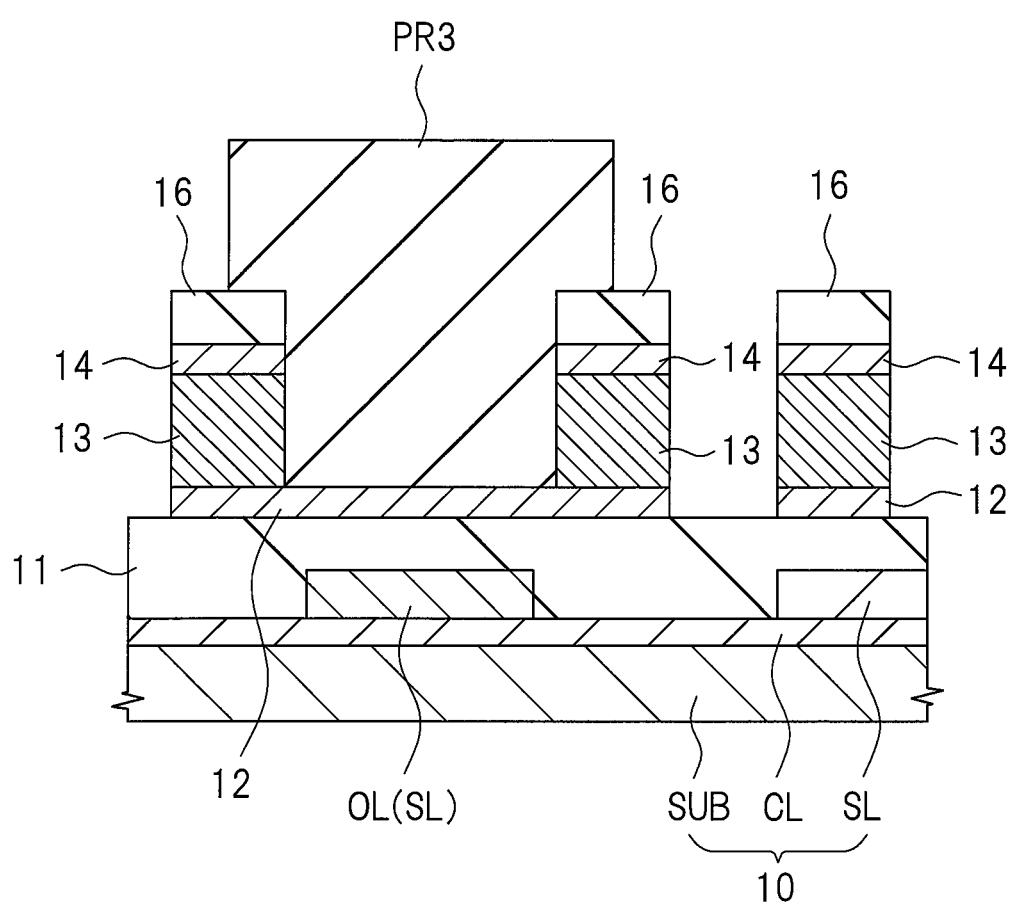
FIG. 12 is a cross-sectional view showing a principal part of the semiconductor device in the manufacturing process subsequent to FIG. 9 and FIG. 10.

Next, as shown in FIG. 11 and FIG. 12, a photoresist film PR3 which covers a heater formation region is formed on the bottom barrier metal film 12 in the heater formation region, and the bottom barrier metal film 12 is patterned by dry etching using the photoresist film PR3 as a mask.

In this dry etching process, the top barrier metal film 14 is covered with the silicon oxide film (hard mask) 16, and thus the top barrier metal film 14 in the region which is not covered with the photoresist film PR3 is not etched.

Accordingly, the bottom barrier metal film 12 in the region other than the heater formation region and a wiring formation region is removed, and the bottom barrier metal film 12 is left only in the heater formation region and the wiring formation region.

Figure 13:
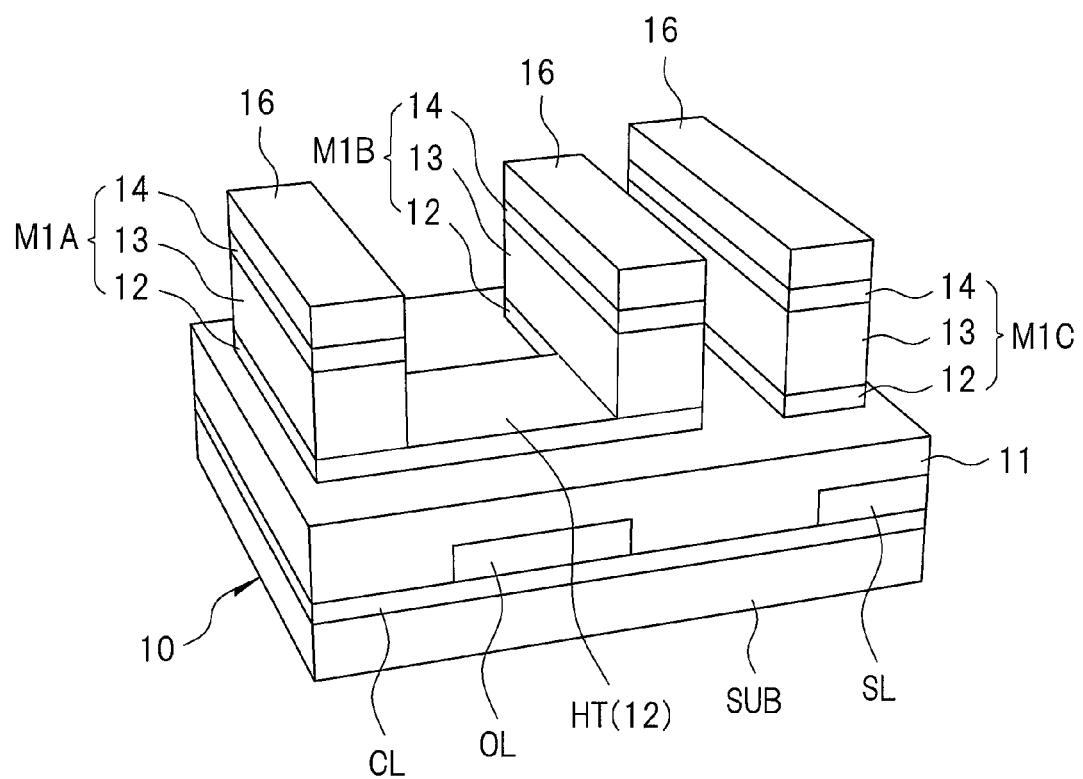
FIG. 13 is a perspective view showing a principal part of the semiconductor device in the manufacturing process subsequent to FIG. 11 and FIG. 12.
Figure 14:
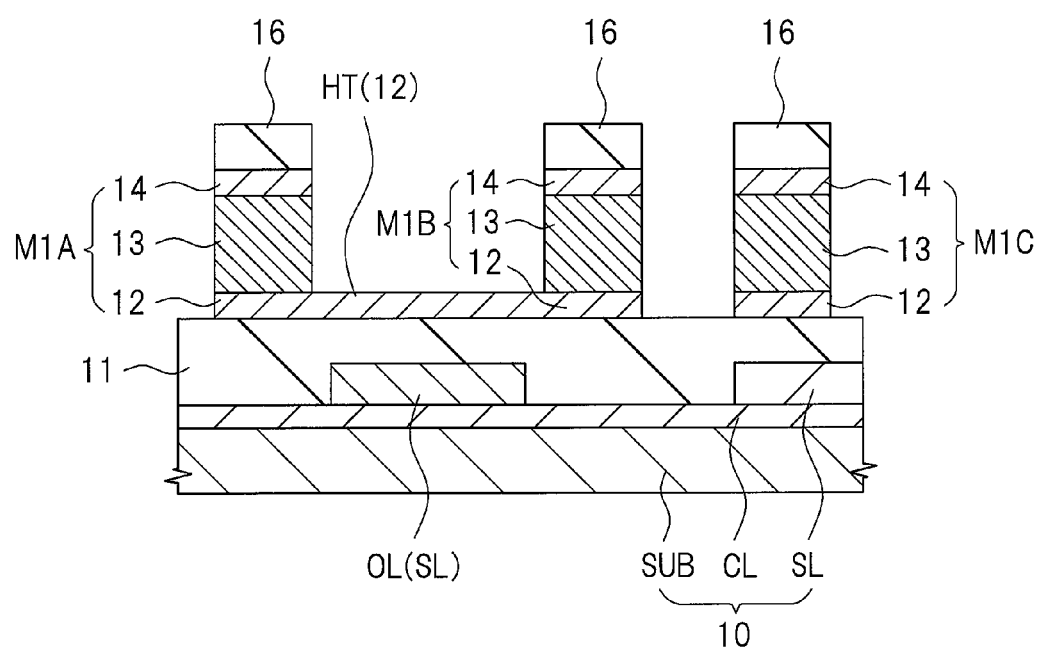
FIG. 14 is a cross-sectional view showing a principal part of the semiconductor device in the manufacturing process subsequent to FIG. 11 and FIG. 12.

Next, the photoresist film PR3 is removed, thereby forming the wirings M1A, M1B and M1C on the silicon oxide film 11 as shown in FIG. 13 and FIG. 14. In addition, the heater HT, which is interposed between the wiring M1A and the wiring M1B and is constituted integrally with the bottom barrier metal film 12 of the wiring M1A and the bottom barrier metal film 12 of the wiring M1B, is formed on the silicon oxide film 11 over the optical waveguide OL.

Then, after covering the wirings M1A, M1B and M1C and the heater HT with the protection film 20, the SOI substrate (SOI wafer) 10 is diced and divided into a plurality of chips, so that the semiconductor device of the first embodiment shown in FIG. 1 is completed.

As described above, according to the first embodiment, the bottom barrier metal film 12 of each of the pair of wirings M1A and M1B electrically connected to the heater HT is formed integrally with the heater HT, and it is thus unnecessary to form the heater HT and the wirings M1A and M1B in separate processes.

In addition, since the pair of wirings M1A and M1B and the heater HT are formed in the same wiring layer (on the silicon oxide film 11), the process of forming the pair of wirings M1A and M1B above the heater HT with an interlayer insulating film interposed therebetween and electrically connecting the pair of wirings M1A and M1B and the heater HT through contact holes formed in the interlayer insulating film is unnecessary.

Consequently, it is possible to largely shorten the process of forming the heater HT and the pair of wirings M1A and M1B compared with the case where the pair of wirings M1A and M1B is formed above the heater HT with an interlayer insulating film interposed therebetween, and it is possible to reduce the manufacturing cost of the semiconductor device in which the silicon integrated circuits and the optical waveguides OL are formed in the same SOI substrate 10.

Second Embodiment

In the first embodiment described above, the bottom barrier metal film 12 constituting a part of the wiring material is used to form the heater HT. Meanwhile, in the second embodiment, a bottom barrier metal film and a top barrier metal film constituting a part of a wiring material are used to form the heater HT.

Hereinafter, a manufacturing method of a semiconductor device according to the second embodiment will be described in the order of processes with reference to FIG. 15 to FIG. 26.

Figure 15:
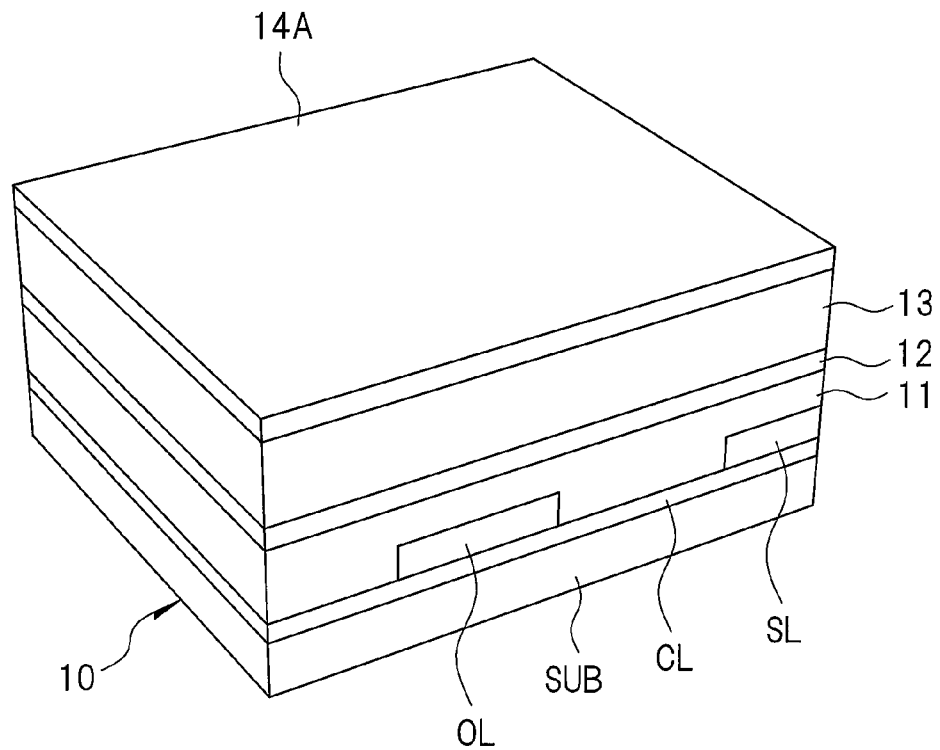
FIG. 15 is a perspective view showing a principal part of a semiconductor device in a manufacturing process according to a second embodiment.
Figure 16:
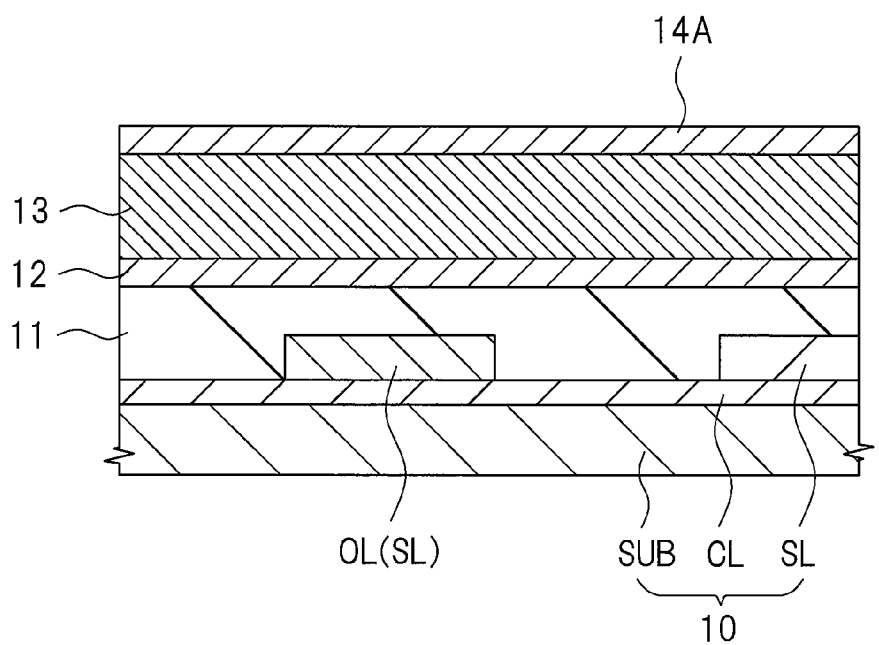
FIG. 16 is a cross-sectional view showing a principal part of the semiconductor device in the manufacturing process according to the second embodiment.

First, as shown in FIG. 15 and FIG. 16, the optical waveguide OL made of the semiconductor layer SL is formed in a part of the SOI substrate 10, and the silicon oxide film 11 is deposited over the optical waveguide OL and the semiconductor layer SL. Thereafter, the wiring material (bottom barrier metal film 12, aluminum-copper alloy film 13 and first top barrier metal film 14A) is deposited over the silicon oxide film 11.

The process up to the deposition of the silicon oxide film 11 over the optical waveguide OL and the semiconductor layer SL is the same as that of the first embodiment, but the silicon oxide film (hard mask) 16 is not formed on the first top barrier metal film 14A in this process.

Figure 17:
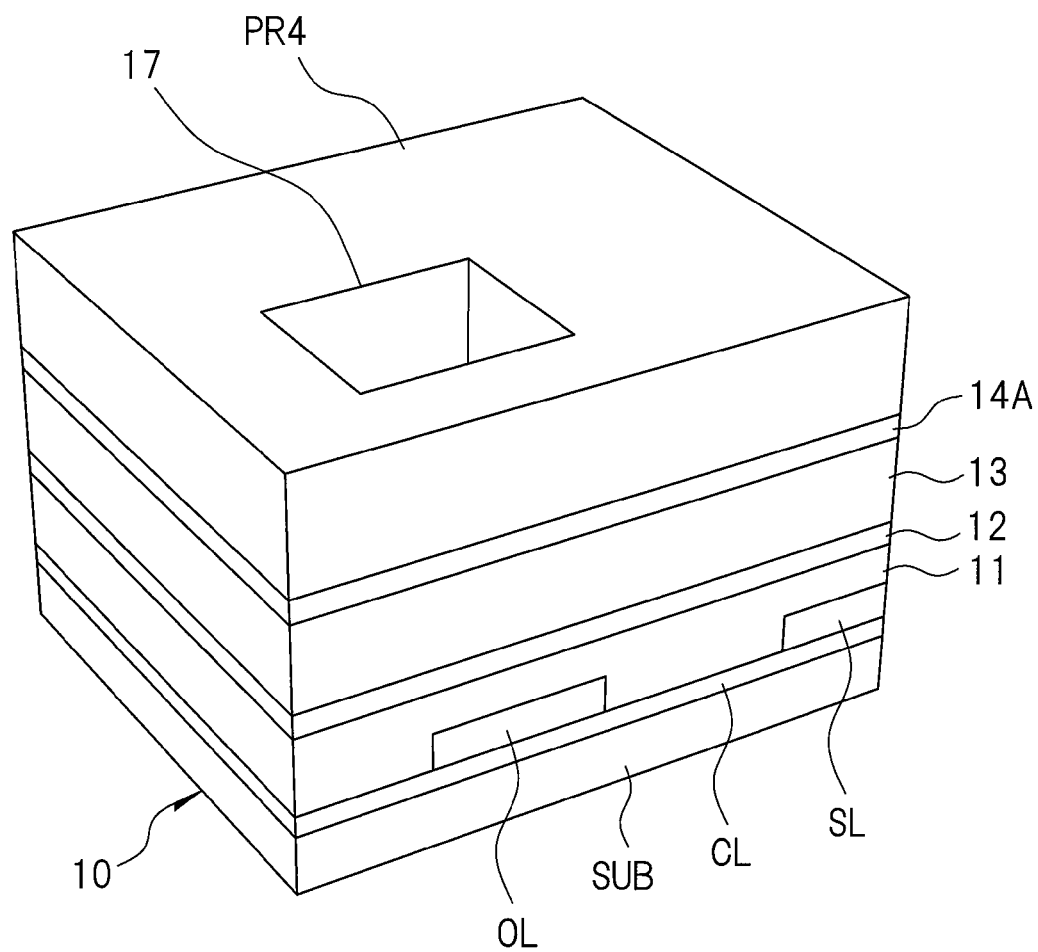
FIG. 17 is a perspective view showing a principal part of the semiconductor device in the manufacturing process subsequent to FIG. 15 and FIG. 16.
Figure 18:
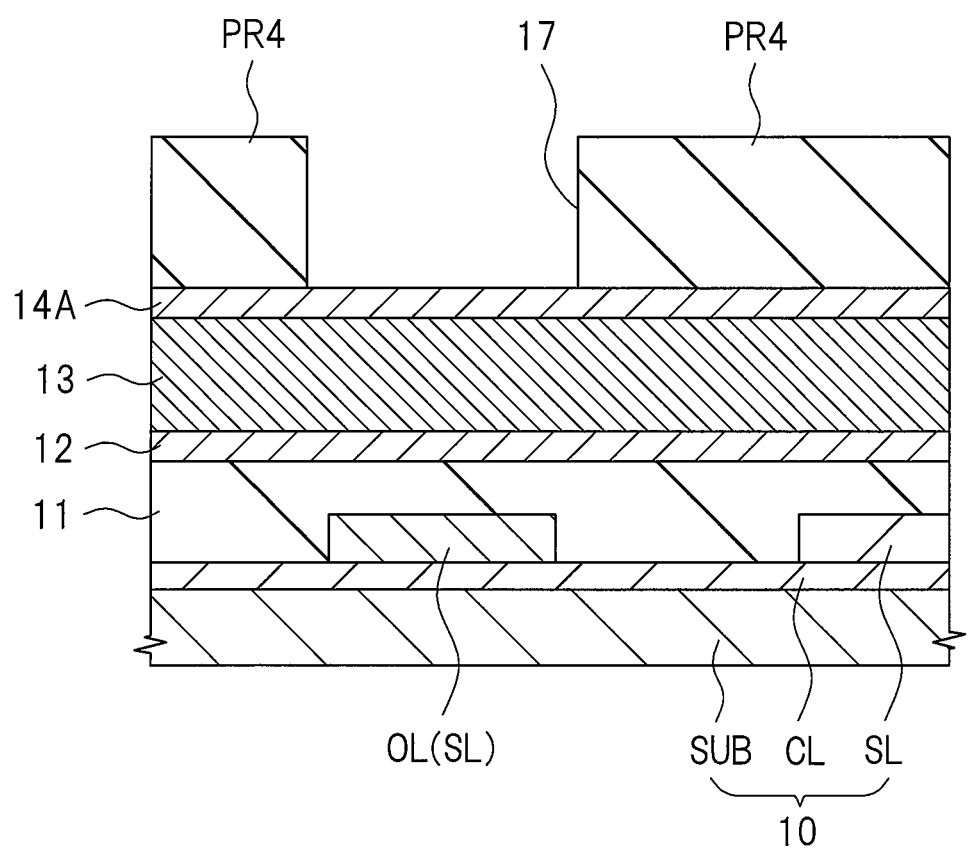
FIG. 18 is a cross-sectional view showing a principal part of the semiconductor device in the manufacturing process subsequent to FIG. 15 and FIG. 16.

Next, as shown in FIG. 17 and FIG. 18, a photoresist film PR4 is formed on the first top barrier metal film 14A. The photoresist film PR4 has an opening 17 through which the surface of the first top barrier metal film 14A in a region which does not overlap the formation regions of the wirings M1A and M1B in the heater formation region, that is, in a region other than both end portions of the heater formation region is exposed.

Figure 19:
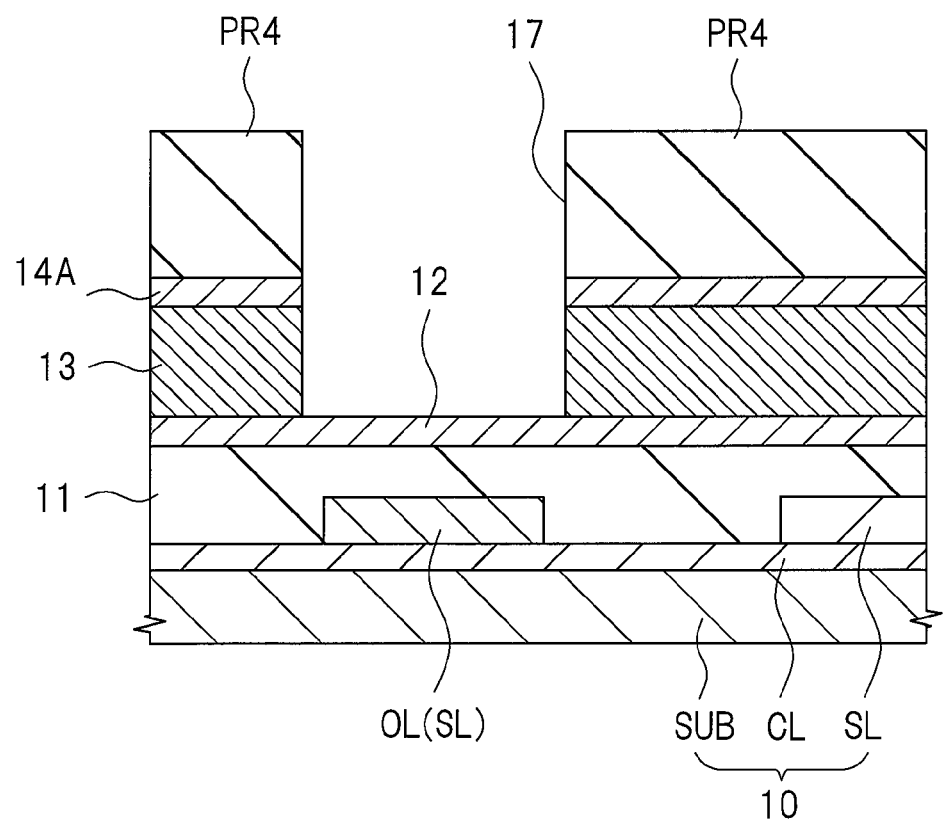
FIG. 19 is a cross-sectional view showing a principal part of the semiconductor device in the manufacturing process subsequent to FIG. 17 and FIG. 18.

Subsequently, as shown in FIG. 19, the first top barrier metal film 14A exposed at the bottom of the opening 17 and the aluminum-copper alloy film 13 below the first top barrier metal film 14A are sequentially dry-etched with using the photoresist film PR4 as a mask, thereby exposing the surface of the bottom barrier metal film 12 at the bottom of the opening 17 of the photoresist film PR4.

Figure 20:
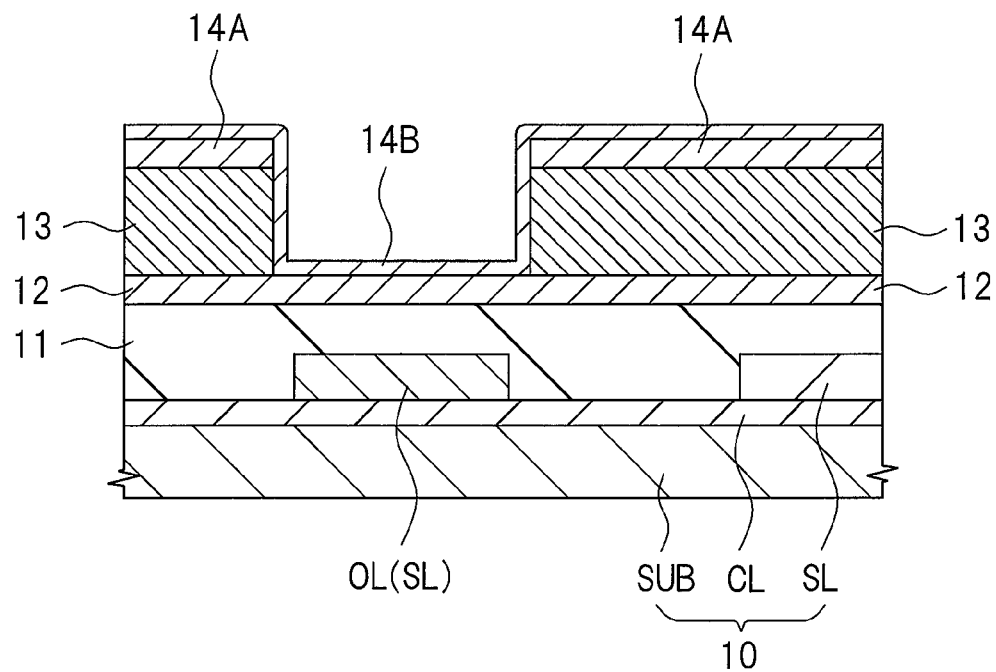
FIG. 20 is a cross-sectional view showing a principal part of the semiconductor device in the manufacturing process subsequent to FIG. 19.

Next, after the photoresist film PR4 is removed, a second top barrier metal film 14B is deposited over the first top barrier metal film 14A as shown in FIG. 20. At this time, the second top barrier metal film 14B is deposited also on the bottom barrier metal film 12 exposed by the above-mentioned dry etching process using the photoresist film PR4 as a mask.

The second top barrier metal film 14B is formed of the same wiring material as that of the first top barrier metal film 14A (for example, titanium nitride film or laminated film of a titanium nitride film and a titanium film). In addition, from the viewpoint of suppressing the increase of electric resistance of the wirings M1A, M1B and M1C each having aluminum as a main conductive film, the total film thickness obtained by adding the film thickness of the first top barrier metal film 14A and the film thickness of the second top barrier metal film 14B is preferably made substantially equal to the film thickness of the top barrier metal film 14 of the first embodiment described above.

Figure 21:
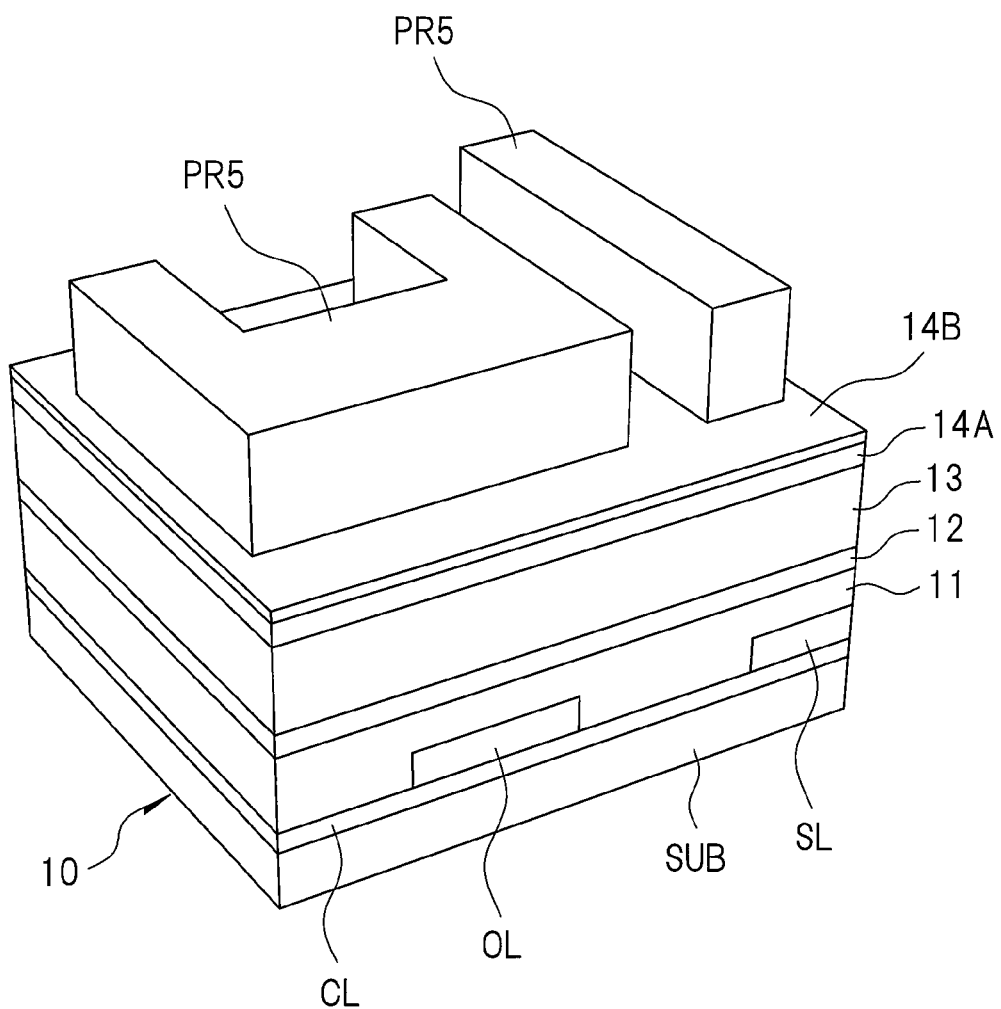
FIG. 21 is a perspective view showing a principal part of the semiconductor device in the manufacturing process subsequent to FIG. 20.
Figure 22:
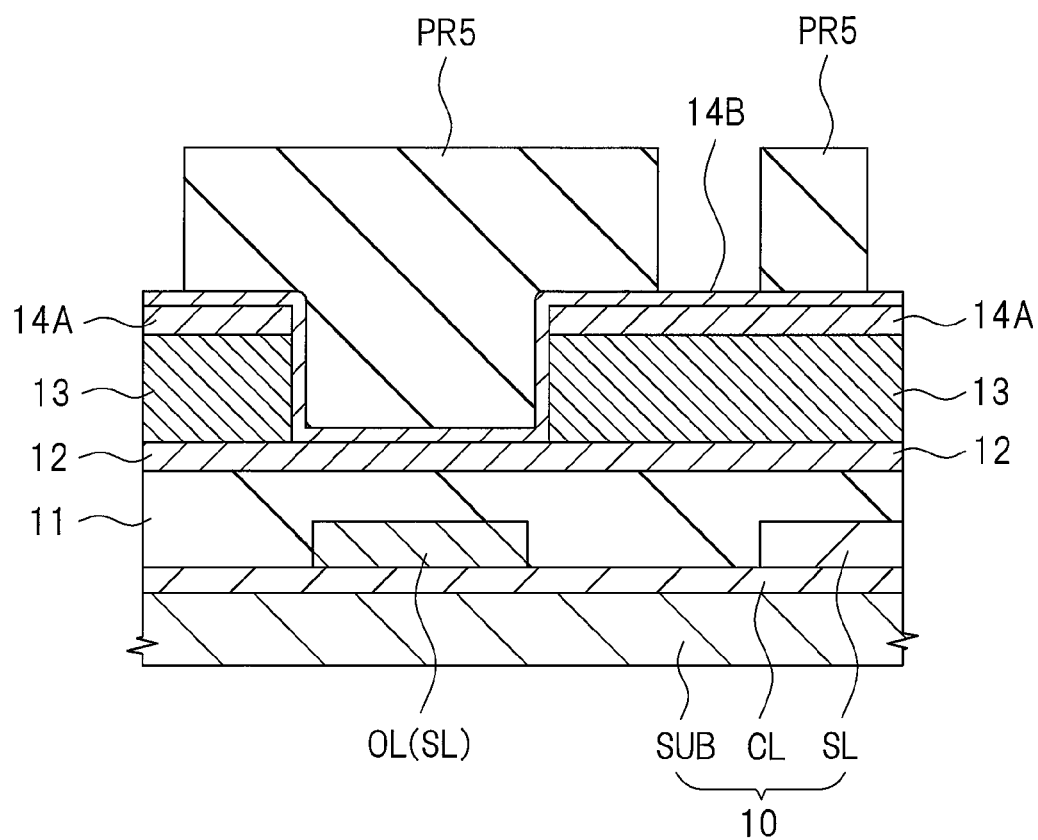
FIG. 22 is a cross-sectional view showing a principal part of the semiconductor device in the manufacturing process subsequent to FIG. 20.

Next, as shown in FIG. 21 and FIG. 22, a photoresist film PR5 which covers the wiring formation region and the heater formation region is formed on the second top barrier metal film 14B. Namely, the photoresist film PR5 having a pattern which overlaps the patterns of the wirings M1A, M1B and M1C and the pattern of the heater HT is formed on the second top barrier metal film 14B.

Figure 23:
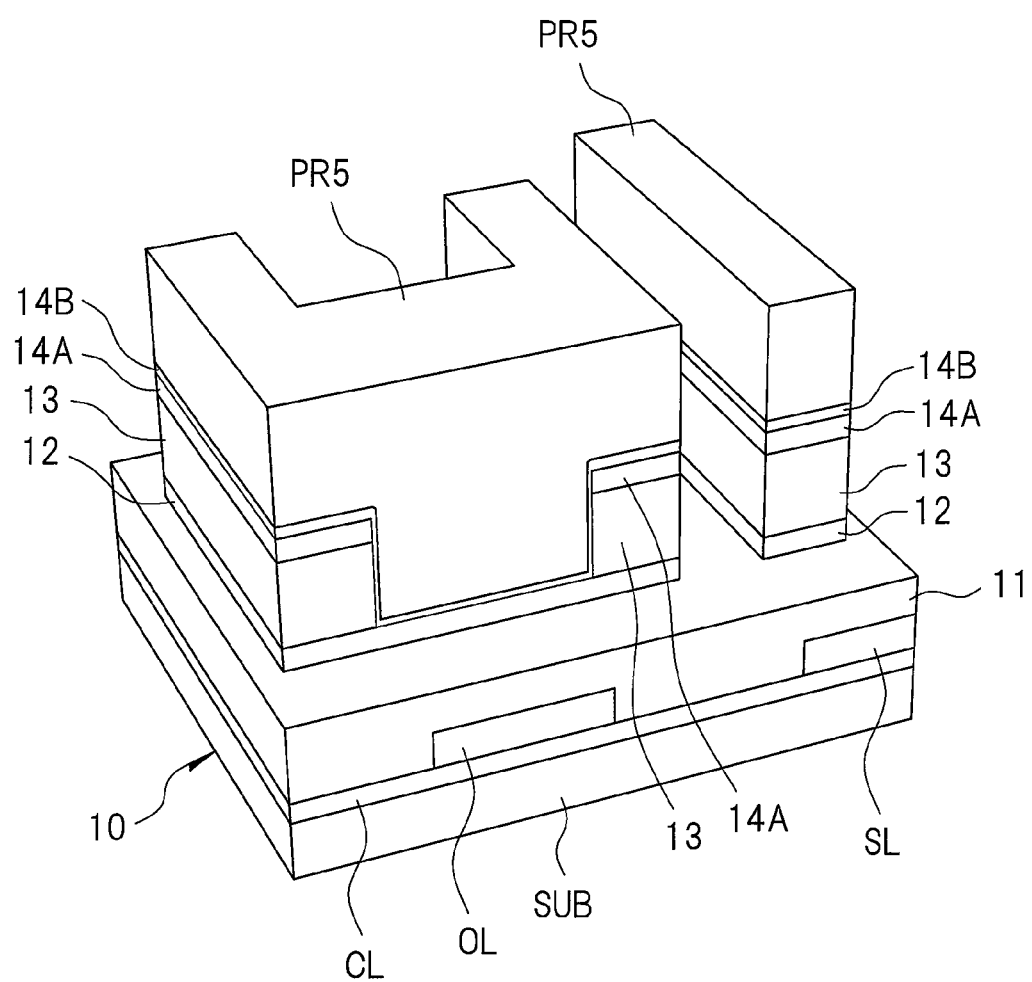
FIG. 23 is a perspective view showing a principal part of the semiconductor device in the manufacturing process subsequent to FIG. 21 and FIG. 22.
Figure 24:
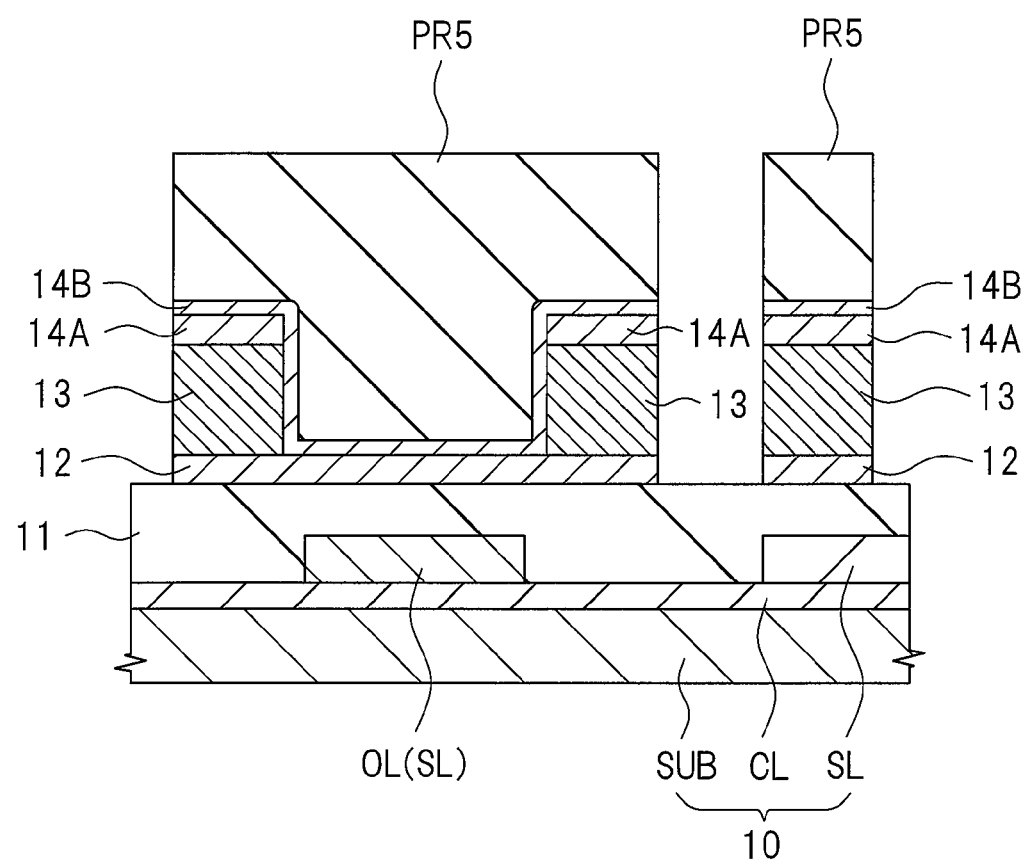
FIG. 24 is a cross-sectional view showing a principal part of the semiconductor device in the manufacturing process subsequent to FIG. 21 and FIG. 22.
Figure 25:
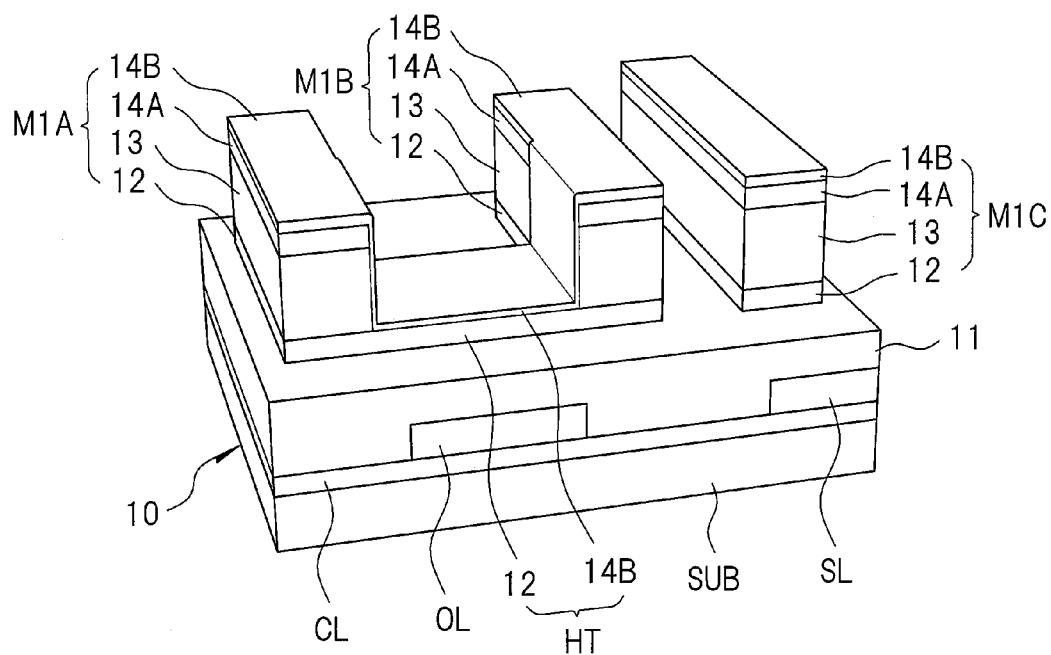
FIG. 25 is a perspective view showing a principal part of the semiconductor device in the manufacturing process subsequent to FIG. 23 and FIG. 24.
Figure 26:
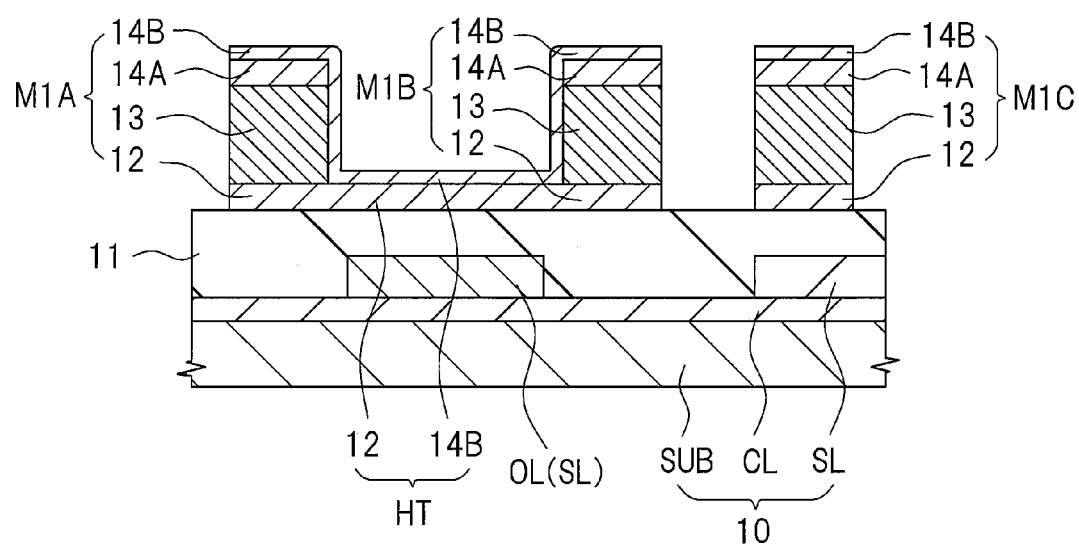
FIG. 26 is a cross-sectional view showing a principal part of the semiconductor device in the manufacturing process subsequent to FIG. 23 and FIG. 24.

Next, as shown in FIG. 23 and FIG. 24, the wiring material (second top barrier metal film 14B, first top barrier metal film 14A, aluminum-copper alloy film 13 and bottom barrier metal film 12) is patterned by dry etching using the photoresist film PR5 as a mask, and the photoresist film PR5 is then removed, so that the wirings M1A, M1B and M1C constituted of the laminated film of the bottom barrier metal film 12, the aluminum-copper alloy film 13, the first top barrier metal film 14A and the second top barrier metal film 14B and the heater HT constituted of the laminated film of the bottom barrier metal film 12 and the second top barrier metal film 14B are formed on the silicon oxide film 11 as shown in FIG. 25 and FIG. 26.

Thereafter, though not illustrated, the protection film 20 (see FIG. 1) to cover the wirings M1A, M1B and M1C and the heater HT is formed, and the SOI substrate (SOI wafer) 10 is diced and divided into a plurality of chips, so that the semiconductor device of the second embodiment is completed.

Consequently, according to the second embodiment, similarly to the first embodiment described above, it is possible to largely shorten the process of forming the heater HT and the pair of wirings M1A and M1B compared with the case where the pair of wirings M1A and M1B are formed above the heater HT with an interlayer insulating film interposed therebetween, and it is possible to reduce the manufacturing cost of the semiconductor device in which the silicon integrated circuits and the optical waveguides OL are formed in the same SOI substrate 10.

In addition, according to the second embodiment, the heater HT is formed of the laminated film of the bottom barrier metal film 12 and the second top barrier metal film 14B.

Accordingly, even when the bottom barrier metal film 12 in the heater formation region is etched and the film thickness thereof is reduced in the dry etching process using the photoresist film PR4 as a mask (process shown in FIG. 19), it is possible to ensure the sufficient film thickness of the heater HT. Namely, the film thickness of the heater HT can be more easily controlled compared with the manufacturing method of the first embodiment in which the heater HT is formed of a single layer of the bottom barrier metal film 12, and it is possible to ensure the degree of design freedom.

Third Embodiment

In the first embodiment described above, the bottom barrier metal film 12 constituting a part of the wiring material is used to form the heater HT, and in the second embodiment, the laminated film of the bottom barrier metal film 12 and the second top barrier metal film 14B constituting a part of the wiring material is used to form the heater HT. Meanwhile, in the third embodiment, a top barrier metal film is used to form the heater HT.

Hereinafter, a manufacturing method of a semiconductor device according to the third embodiment will be described in the order of processes with reference to FIG. 27 to FIG. 32.

Figure 27:
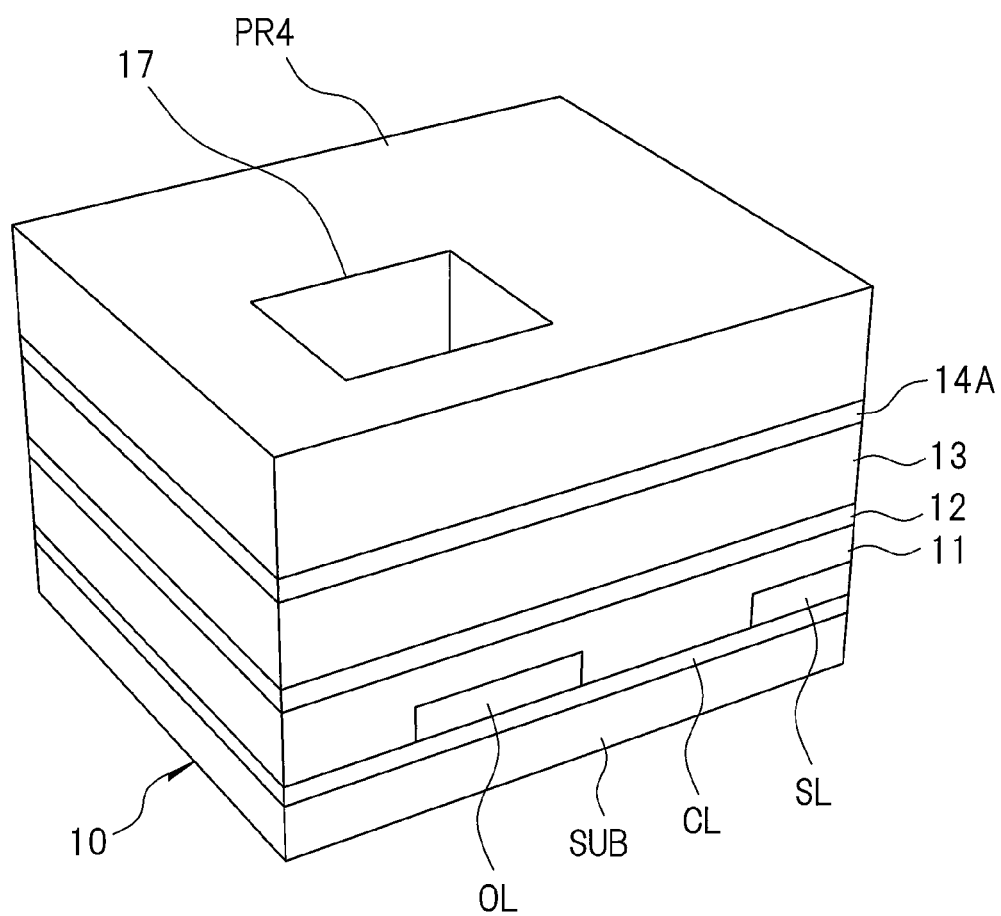
FIG. 27 is a perspective view showing a principal part of a semiconductor device in a manufacturing process according to a third embodiment.
Figure 28:
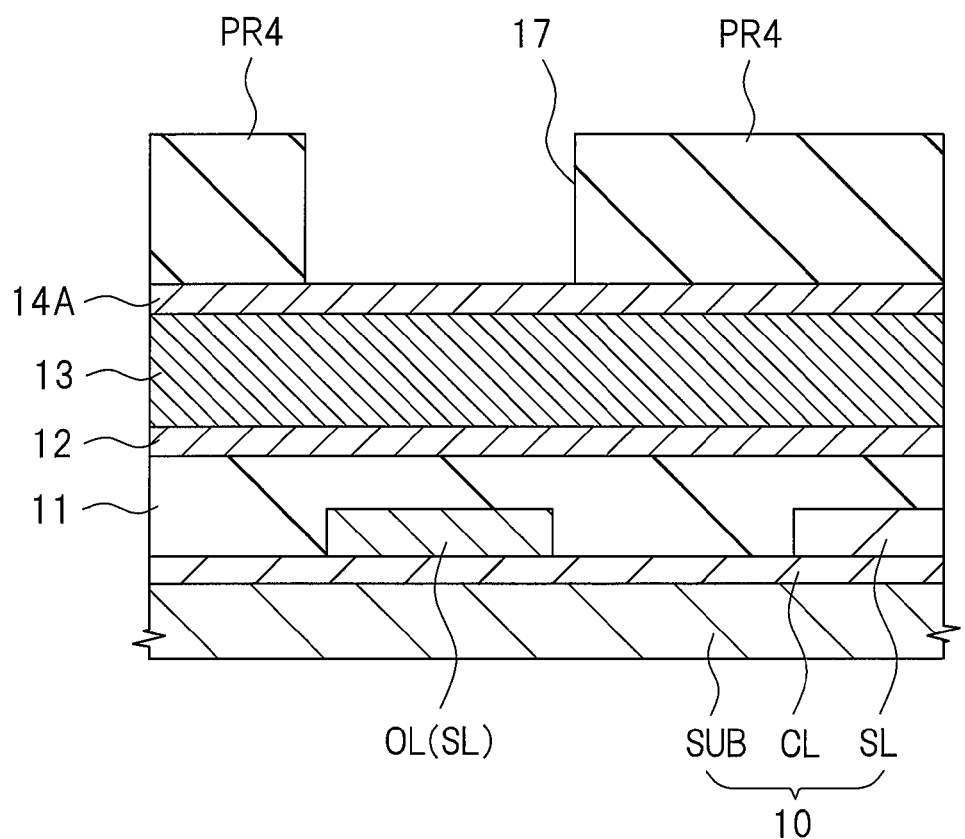
FIG. 28 is a cross-sectional view showing a principal part of the semiconductor device in the manufacturing process according to the third embodiment.

First, as shown in FIG. 27 and FIG. 28, in accordance with the same process as that shown in FIG. 15 to FIG. 18 of the second embodiment described above, the wiring material (bottom barrier metal film 12, aluminum-copper alloy film 13 and first top barrier metal film 14A) is deposited over the silicon oxide film 11, and then the photoresist film PR4 is formed on the first top barrier metal film 14A. The photoresist film PR4 is the same as that used in the second embodiment described above, and has the opening 17 on the first top barrier metal film 14A in a region which does not overlap the formation regions of the wirings M1A and M1B in the heater formation region, that is, in a region other than both end portions of the heater formation region.

Figure 29:
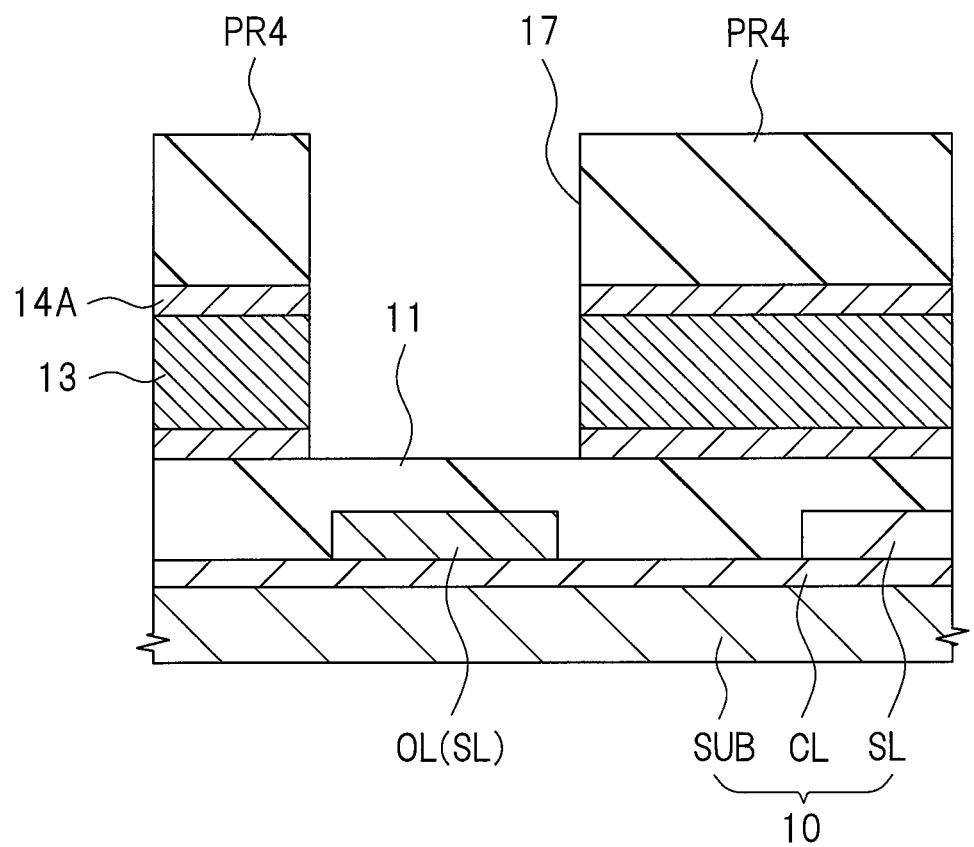
FIG. 29 is a cross-sectional view showing a principal part of the semiconductor device in the manufacturing process subsequent to FIG. 27 and FIG. 28.

Subsequently, as shown in FIG. 29, the first top barrier metal film 14A exposed at the bottom of the opening 17, the aluminum-copper alloy film 13 and the bottom barrier metal film 12 are sequentially dry-etched with using the photoresist film PR4 as a mask, thereby exposing the surface of the silicon oxide film 11 at the bottom of the opening 17. As described above, in contrast to the second embodiment in which the bottom barrier metal film 12 is left at the bottom of the opening 17 of the photoresist film PR4, the bottom barrier metal film 12 at the bottom of the opening 17 of the photoresist film PR4 is also removed and the surface of the silicon oxide film 11 is exposed in the third embodiment.

Figure 30:
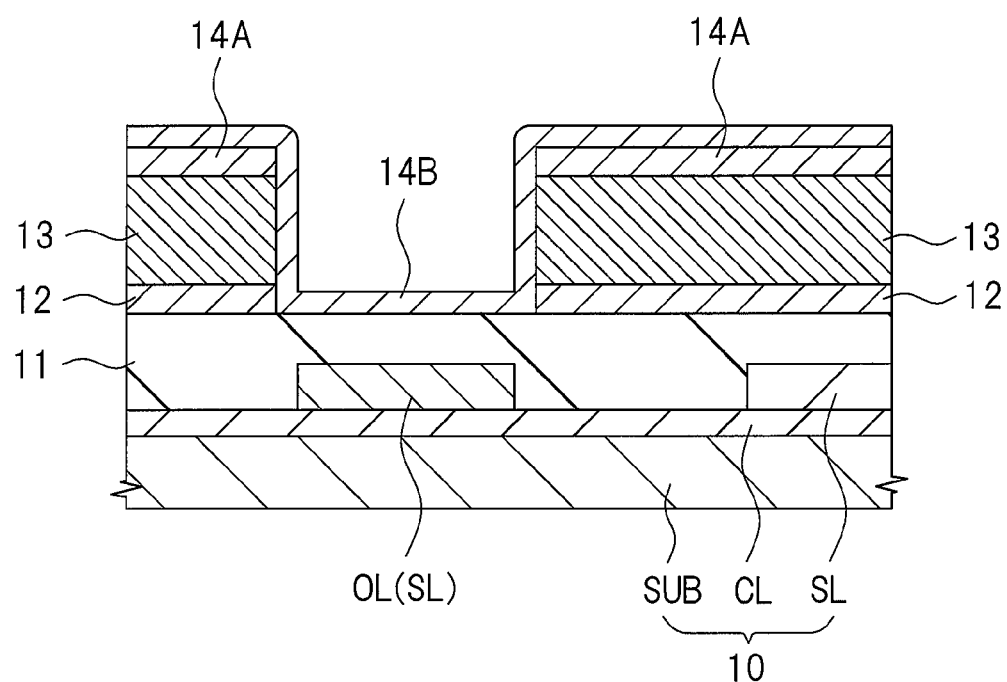
FIG. 30 is a cross-sectional view showing a principal part of the semiconductor device in the manufacturing process subsequent to FIG. 29.

Next, after the photoresist film PR4 is removed, the second top barrier metal film 14B is deposited over the first top barrier metal film 14A as shown in FIG. 30. The second top barrier metal film 14B is deposited also on the silicon oxide film 11 in the heater formation region exposed by the above-mentioned dry etching using the photoresist film PR4 as a mask.

Figure 31:
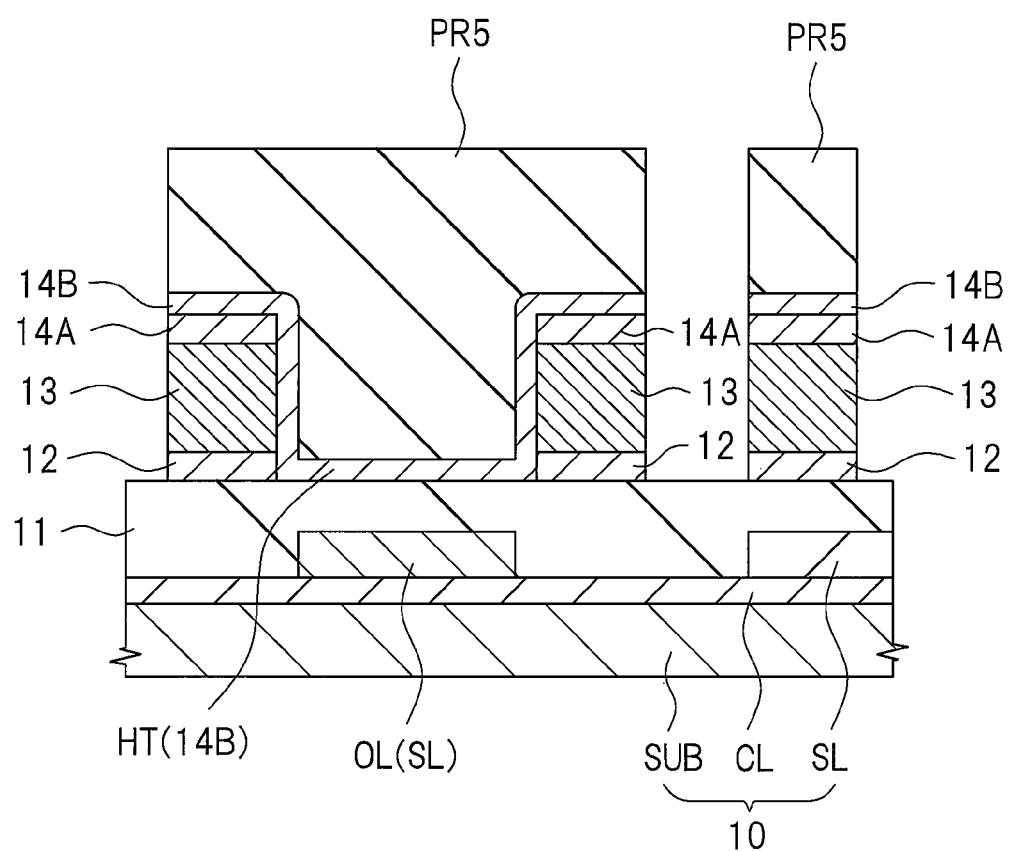
FIG. 31 is a cross-sectional view showing a principal part of the semiconductor device in the manufacturing process subsequent to FIG. 30.
Figure 32:
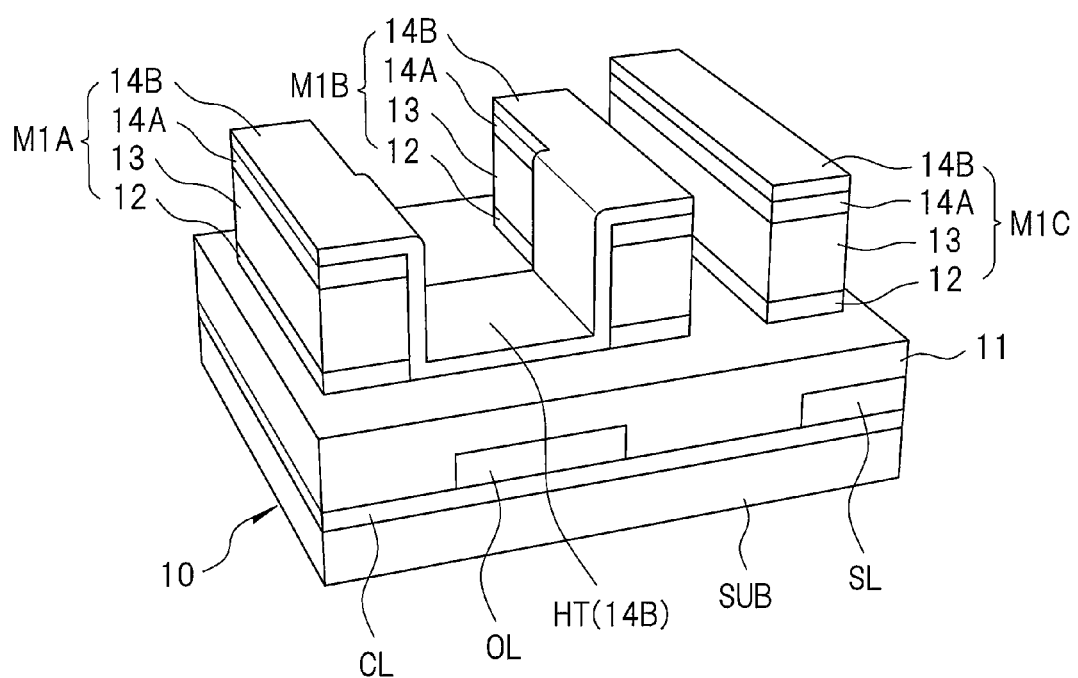
FIG. 32 is a perspective view showing a principal part of the semiconductor device in the manufacturing process subsequent to FIG. 31.

The process thereafter is the same as that of the second embodiment. Namely, as shown in FIG. 31, the photoresist film PR5 which covers the formation regions of the wirings M1A, M1B and M1C and the formation region of the heater HT is formed on the second top barrier metal film 14B, and the wiring material (second top barrier metal film 14B, first top barrier metal film 14A, aluminum-copper alloy film 13 and bottom barrier metal film 12) is patterned by dry etching using the photoresist film PR5 as a mask. Subsequently, the photoresist film PR5 is removed, so that the wirings M1A, M1B and M1C constituted of the laminated film of the bottom barrier metal film 12, the aluminum-copper alloy film 13, the first top barrier metal film 14A and the second top barrier metal film 14B and the heater HT constituted of the second top barrier metal film 14B are formed on the silicon oxide film 11 as shown in FIG. 32.

Thereafter, though not illustrated, the protection film 20 (see FIG. 1) to cover the wirings M1A, M1B and M1C and the heater HT is formed, and the SOI substrate (SOI wafer) 10 is diced and divided into a plurality of chips, so that the semiconductor device of the third embodiment is completed.

Consequently, according to the third embodiment, similarly to the first embodiment and the second embodiment described above, it is possible to largely shorten the process of forming the heater HT and the pair of wirings M1A and M1B compared with the case where the pair of wirings M1A and M1B are formed above the heater HT with an interlayer insulating film interposed therebetween, and it is possible to reduce the manufacturing cost of the semiconductor device in which the silicon integrated circuits and the optical waveguides OL are formed in the same SOI substrate 10.

In addition, according to the third embodiment, the upper surface of the material constituting the heater HT (second top barrier metal film 14B) is not exposed to the etching atmosphere in the process of patterning a part of the wiring material. Therefore, it is possible to ensure the sufficient film thickness of the heater HT, and also possible to suppress the degradation of film quality (corrosion or the like) of the heater HT due to the exposure to the etching atmosphere.

In the foregoing, the invention made by the inventor of the present invention has been concretely described based on the embodiments. However, it is needless to say that the present invention is not limited to the foregoing embodiments and various modifications and alterations can be made within the scope of the present invention.

In the first to third embodiments described above, a titanium nitride film and a laminated film of a titanium nitride film and a titanium film are shown as examples of the barrier metal film constituting the heater, but the barrier metal film is not limited to these, and it is possible to use other conductive films such as a tantalum nitride (TaN) film and a laminated film of a tantalum nitride film and a tantalum film having both of the function as the barrier metal film to aluminum constituting the main conductive film of the wiring and the characteristics as the heater material and the wiring material (electrical resistance and the like).

In the first to third embodiments described above, the semiconductor device in which the silicon integrated circuits and the optical waveguides are formed in the same SOI substrate has been described as an example, but the semiconductor device is not limited to this, and the embodiments can be applied also to the case where the silicon integrated circuits and the optical waveguides are formed in respectively different semiconductor substrates (semiconductor chips).

What is claimed is:

1. A semiconductor device comprising:
    an SOI substrate including a support substrate, a silicon oxide layer formed over the support substrate, and a semiconductor layer formed over the silicon oxide layer;
    an optical waveguide formed in the semiconductor layer of the SOI substrate;
    a heater formed on a first insulating film which covers the optical waveguide; and
    a first wiring and a second wiring which are formed on the first insulating film and are electrically connected to the heater,
    wherein each of the first wiring and the second wiring is constituted of a laminated film including a barrier metal film and a main conductive film, and
    the heater is formed to include the barrier metal film constituting a part of each of the first wiring and the second wiring.

2. The semiconductor device according to claim 1,
    wherein the main conductive film is made of a conductive film composed mainly of aluminum, and
    the barrier metal film is constituted of a titanium nitride film or a laminated film of a titanium nitride film and a titanium film.

3. The semiconductor device according to claim 1,
    wherein each of the first wiring and the second wiring is constituted of a laminated film of a first barrier metal film, a main conductive film and a second barrier metal film, and
    the heater is constituted integrally with the first barrier metal film constituting a part of each of the first wiring and the second wiring.

4. The semiconductor device according to claim 1,
    wherein each of the first wiring and the second wiring is constituted of a laminated film of a first barrier metal film, a main conductive film, a second barrier metal film and a third barrier metal film, and
    the heater is constituted of a laminated film of the first barrier metal film and the third barrier metal film.

5. The semiconductor device according to claim 1,
    wherein each of the first wiring and the second wiring is constituted of a laminated film of a first barrier metal film, a main conductive film, a second barrier metal film and a third barrier metal film, and
    the heater is constituted of the third barrier metal film.

* * * * *